(12) United States Patent
Choung et al.

(10) Patent No.: US 8,760,200 B2
(45) Date of Patent: Jun. 24, 2014

(54) GATE DRIVING APPARATUS

(71) Applicant: LSIS Co., Ltd., Anyang-si (KR)

(72) Inventors: Jae Seok Choung, Seoul (KR); Gyoung Hun Nam, Goyang-si (KR); Sung Hee Kang, Suwon-si (KR); Jong Bae Kim, Seoul (KR)

(73) Assignee: LSIS Co., Ltd., Anyang-Si, Gyeonggi-Do (KR)

( * ) Notice: Subject to any disclaimer, the term of this patent is extended or adjusted under 35 U.S.C. 154(b) by 0 days.

(21) Appl. No.: 13/857,056

(22) Filed: Apr. 4, 2013

(65) Prior Publication Data

US 2013/0278322 A1   Oct. 24, 2013

(30) Foreign Application Priority Data

Apr. 24, 2012   (KR) .................. 10-2012-0042883

(51) Int. Cl.
*H03B 1/00* (2006.01)
*H03K 3/00* (2006.01)

(52) U.S. Cl.
USPC ........... 327/111; 327/108; 327/112; 327/382; 326/83

(58) Field of Classification Search
USPC .................. 327/108–112, 379, 389, 391; 326/22–27, 81–87
See application file for complete search history.

(56) References Cited

U.S. PATENT DOCUMENTS

| | | | |
|---|---|---|---|
| 5,010,261 A | | 4/1991 | Steigerwald |
| 5,099,138 A | * | 3/1992 | Fukunaga ...................... 327/109 |
| 5,625,312 A | * | 4/1997 | Kawakami et al. ........... 327/483 |
| 6,078,207 A | * | 6/2000 | Oguri ............................ 327/321 |
| 7,151,401 B2 | * | 12/2006 | Inoue ............................ 327/434 |
| 7,782,098 B2 | * | 8/2010 | Hashimoto et al. ........... 327/108 |
| 8,350,601 B2 | * | 1/2013 | Nagata et al. ................. 327/109 |
| 2006/0170043 A1 | | 8/2006 | Liu et al. |
| 2006/0192437 A1 | | 8/2006 | Tolle et al. |
| 2008/0303560 A1 | * | 12/2008 | Higashi et al. ................ 327/108 |
| 2013/0038307 A1 | * | 2/2013 | Saito et al. .................... 323/283 |
| 2013/0063186 A1 | * | 3/2013 | DeBeer et al. ................ 327/109 |
| 2013/0214824 A1 | * | 8/2013 | Umetani ....................... 327/109 |

FOREIGN PATENT DOCUMENTS

JP   2010-022093   1/2010

OTHER PUBLICATIONS

Korean Intellectual Property Office Application Serial No. 10-2012-0042883, Office Action dated May 20, 2013, 3 pages.
Korean Intellectual Property Office Application Serial No. 10-2012-0042883, Notice of Allowance dated Jul. 23, 2013, 6 pages.

* cited by examiner

*Primary Examiner* — Brandon S Cole
(74) *Attorney, Agent, or Firm* — Lee, Hong, Degerman, Kang & Waimey

(57) ABSTRACT

A gate driving apparatus according to the embodiment includes a first switching device, a second switching device that outputs a signal to charge a capacitance of the first switching device, a third switching device connected in parallel to the second switching device to prevent a drop of a voltage output from the second switching device, and a fourth switching device that outputs a signal to discharge the capacitance of the first switching device. An NMOS transistor is used as a main switching device and a PMOS transistor connected in parallel to the NMOS transistor is used as a sub-switching device, so that the chip size is reduced without dropping the output voltage of the gate driving apparatus. The loss of the switching device is prevented by preventing the output voltage of the gate driving apparatus from being dropped.

12 Claims, 4 Drawing Sheets

GATE DRIVING APPARATUS

CROSS REFERENCE TO RELATED APPLICATION

Pursuant to 35 U.S.C. §119(a), this application claims the benefit of earlier filing date and right of priority to Korean Application No. 10-2012-0042883, filed on Apr. 24, 2012, the contents of which is incorporated by reference herein in its entirety.

BACKGROUND

The embodiment relates to a gate driving apparatus for driving an IGBT (insulated gate bipolar mode transistor) in a power semiconductor system. More particularly, the embodiment relates to a gate driving apparatus having an improved output terminal structure for driving an IGBT in a power semiconductor system.

In general, an inverter is extensively used in various industrial fields, such as a field of a motor and various electronic appliances. The inverter is a device to convert DC voltage into AC voltage and includes a switching device and a gate driving apparatus for driving the switching device in order to DC voltage into AC voltage.

The IGBT is extensively used as a switching device for driving the gate driving apparatus. The IGBT is a transistor including emitter, collector and gate terminals, in which the gate terminal is insulated. The IGBT has high input impedance, so the IGBT can be readily and simply driven and minority carriers are not accumulated in the IGBT. That is, the IGBT is a switching device having the advantage of a MOSFET (metal oxide film field effect transistor) that operates at the high speed as well as the advantage of a BJT (bipolar transistor) that generates high current and is fabricated at an inexpensive cost. Since the IGBT has great input capacitance, the inverter requires a gate driving apparatus to drive a gate by amplifying current of a PWM (pulse width modulation) signal.

However, the gate driving apparatus according to the related art has the structural feature suitable for high output voltage and a chip size may be enlarged, so that the chip cost is expensive.

SUMMARY

The embodiment provides a gate driving apparatus capable of preventing output voltage drop while reducing a chip size by connecting an NMOS and a PMOS to an upper portion of an output terminal of the gate driving apparatus in parallel and connecting an NMOS to a lower portion of the output terminal of the gate driving apparatus.

A gate driving apparatus according to the embodiment may include a first switching device, a second switching device that outputs a signal to charge a capacitance of the first switching device, a third switching device connected in parallel to the second switching device to prevent a drop of a voltage output from the second switching device, and a fourth switching device that outputs a signal to discharge the capacitance of the first switching device.

The first switching device may be an insulated gate bipolar transistor, the second and fourth switching devices may be NMOS transistors and the third switching device may be a PMOS transistor.

The gate driving apparatus may further include a driver that receives a pulse width modulation signal to drive the first switching device by supplying a current to the first switching device.

The driver may drive the second switching device and the fourth switching device while setting a dead time.

The driver may turn on the second and third switching devices and turn off the fourth switching device.

The driver may turn off the second and third switching devices and turn on the fourth switching device.

The first switching device may be an insulated gate bipolar transistor and the capacitance of the first switching device may be a gate capacitance of the insulated gate bipolar transistor.

The capacitance of the first switching device may be a parasitic capacitance generated in the first switching device.

A gate driving apparatus according to another embodiment may include a first NMOS transistor, a second NMOS transistor, a PMOS transistor and an insulated gate bipolar transistor.

A drain terminal of the first NMOS transistor may be connected to a terminal of a power source and the PMOS transistor, a gate terminal of the first NMOS transistor may be connected to a driver, and a source terminal of the first NMOS transistor may be connected to a drain terminal of the PMOS transistor, a drain terminal of the second NMOS transistor and a gate terminal of the insulated gate bipolar transistor. A gate terminal of the PMOS transistor may be connected to the driver, a gate terminal of the second NMOS transistor may be connected to the driver, and a source terminal of the second NMOS transistor and an emitter terminal of the insulated gate bipolar transistor may be grounded.

The PMOS transistor may drop an output voltage of the first NMOS transistor.

The driver may turn on the first NMOS transistor and the PMOS transistor and turn off the second NMOS transistor to charge a gate capacitance of the insulated gate bipolar transistor.

The driver may turn off the first NMOS transistor and the PMOS transistor and turn on the second NMOS transistor to discharge a gate capacitance of the insulated gate bipolar transistor.

The driver may prevent an arm short among the first NMOS transistor, the PMOS transistor and the second NMOS transistor by setting a dead time.

According to the embodiment, the NMOS transistor is used as the main switching device and the PMOS transistor connected in parallel to the NMOS transistor is used as the sub-switching device, so that the chip size can be reduced without dropping the output voltage of the gate driving apparatus.

In addition, according to the embodiment, the loss of the switching device can be prevented by preventing the output voltage of the gate driving apparatus from being dropped.

Meanwhile, other various effects will be directly or indirectly disclosed in the detailed description of the embodiment.

DETAILED DESCRIPTION OF THE EMBODIMENTS

Hereinafter, embodiments will be described in detail with reference to accompanying drawings so that those skilled in the art can easily work with the embodiments.

In a power semiconductor system, an output terminal of a gate driving apparatus has a push-pull structure and the gate driving apparatus employs two NMOS elements or a PMOS element and an NMOS element.

Figure 1:
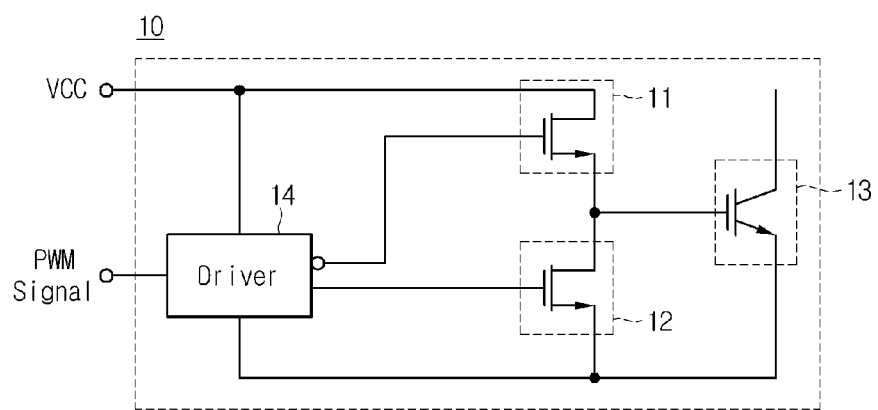
FIG. 1 is a circuit diagram of a gate driving apparatus according to the first embodiment.
Figure 3:
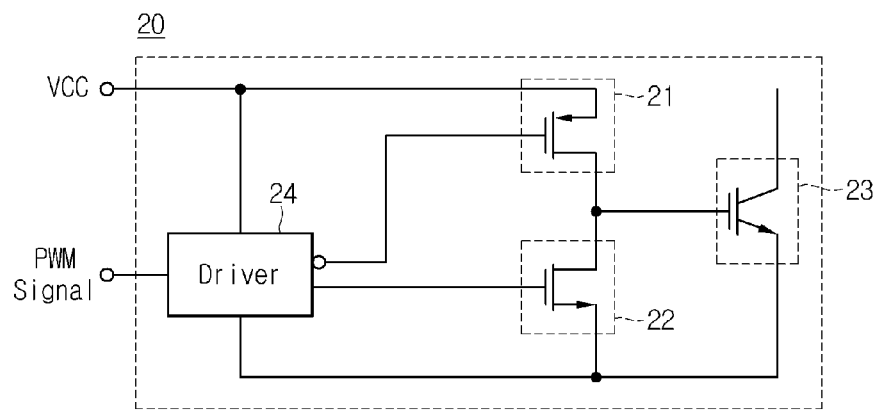
FIG. 3 is a circuit diagram of a gate driving apparatus according to the second embodiment.

FIG. 1 shows an embodiment using two NMOS devices provided at an output terminal of the gate driving apparatus and FIG. 3 shows another embodiment using a PMOS device and an NMOS device.

FIG. 1 is a circuit diagram of a gate driving apparatus according to the first embodiment.

Referring to FIG. 1, the gate driving apparatus 10 includes a first NMOS transistor 11, a second NMOS transistor 12, an IGBT 13 and a driver 14.

The first NMOS transistor 11 is located higher than the second NMOS transistor 12. A drain terminal of the first NMOS transistor 11 is connected to a power supply terminal VCC and a source terminal of the first NMOS transistor 11 is connected to a drain terminal of the second NMOS transistor 12 and a gate terminal of the IGBT 13. A gate terminal of the first NMOS transistor 11 is connected to the driver 14.

The second NMOS transistor 12 is located lower than the first NMOS transistor 11. The drain terminal of the second NMOS transistor 12 is connected to a source terminal of the first NMOS transistor 11 and the gate terminal of the IGBT 13. A source terminal of the second NMOS transistor 12 is grounded and a gate terminal of the second NMOS transistor 12 is connected to the driver 14.

An emitter terminal of the IGBT 13 is grounded and the gate terminal of the IGBT 13 is connected to the source terminal of the first NMOS transistor 11 and the drain terminal of the second NMOS transistor 12.

The gate driving apparatus 10 amplifies a switching signal generated from the driver 14.

A signal having intensity the same as that of a signal output from the driver 14 and a phase opposite to that of the signal output from the driver 14 is input into the gate terminal of the first NMOS transistor 11.

The signal output from the driver 14 is input into the gate terminal of the second NMOS transistor 12 and the second NMOS transistor 12 outputs an amplified gate switching signal to drive the gate of the IGBT 13.

The driver 14 drives the gate driving apparatus 10 and can prevent the arm short by setting a dead time upon the operation of the first and second NMOS transistors 11 and 12. The dead time signifies a time during which the other switching device is not turned on until one switching device is completely turned off. If the dead time is not set in the switching device, two switching devices may be simultaneously turned on, so excessive current may flow in a short period of time, so that the efficiency is lowered and the switching devices are damaged.

In a state that the operating power is applied to the power supply terminal VCC, the gate driving apparatus 10 outputs the switching signal according to a control signal input thereto from a control unit (not shown). If the IGBT 13 is turned on, the first NMOS transistor 11 is turned on and the second NMOS transistor 12 is turned off. After that, the gate capacitance of the IGBT 13 is charged by the first NMOS transistor 11 so that the gate voltage rises. If the IGBT 13 is turned off, the first NMOS transistor 11 is turned off and the second NMOS transistor 12 is turned on and the gate capacitance of the IGBT 13 is discharged by the first NMOS transistor 11 so that the gate voltage drops.

Figure 2:
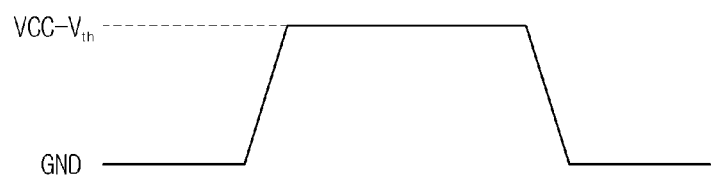
FIG. 2 is a view to explain an output waveform of a first NMOS transistor of a gate driving apparatus according to the first embodiment.

FIG. 2 is a view to explain an output waveform of the first NMOS transistor of the gate driving apparatus according to the first embodiment.

An on-resistance value of the first NMOS transistor 11 is low, so the first NMOS transistor 11 is advantageous to drive high current. However, as shown in FIG. 2, if output voltage rises by a predetermined value or more, in which the predetermined value is calculated by subtracting threshold voltage Vth from power supply voltage VCC (VCC-Vth), the voltage drop may occur to the extent of the threshold voltage based on the power supply voltage VCC. A switching device, such as the IGBT, must have gate driving voltage having a predetermined level or more. Otherwise, the turn-on loss of the switching device is increased so that the efficiency is lowered and the life span of the switching device is shortened. In order to prevent the voltage drop, power supply voltage is increased corresponding to the voltage drop, causing great power consumption of the gate driving apparatus.

FIG. 3 is a circuit diagram of the gate driving apparatus according to the second embodiment.

Referring to FIG. 2, the gate driving apparatus 20 includes a PMOS transistor 21, an NMOS transistor 22, an IGBT 23 and a driver 24.

The PMOS transistor 21 is located higher than the NMOS transistor 22. A source terminal of the PMOS transistor 21 is connected to a power supply terminal VCC and a drain terminal of the PMOS transistor 21 is connected to a drain terminal of the NMOS transistor 22 and a gate terminal of the IGBT 23. A gate terminal of the PMOS transistor 21 is connected to the driver 24.

The NMOS transistor 22 is located lower than the PMOS transistor 21. The drain terminal of the NMOS transistor 22 is connected to the drain terminal of the PMOS transistor 21 and the gate terminal of the IGBT 23. A source terminal of the NMOS transistor 22 is grounded and a gate terminal of the NMOS transistor 22 is connected to the driver 24.

An emitter terminal of the IGBT 23 is grounded and the gate terminal of the IGBT 23 is connected to the drain terminal of the PMOS transistor 21 and the drain terminal of the NMOS transistor 22.

The gate driving apparatus 20 amplifies a switching signal generated from the driver 24.

A signal output from the driver 24 is input into the gate terminal of the PMOS transistor 21.

The signal output from the driver 24 is input into the gate terminal of the NMOS transistor 22 and the NMOS transistor 22 outputs an amplified gate switching signal to drive the gate of the IGBT 23.

The driver 24 drives the gate driving apparatus 20 and can prevent the arm short by setting a dead time upon the operation of the PMOS and NMOS transistors 21 and 22.

In a state that the operating power is applied to the power supply terminal VCC, the gate driving apparatus 20 outputs the switching signal according to a control signal input thereto from a control unit (not shown). If the IGBT 23 is turned on, the PMOS transistor 21 is turned on and the NMOS transistor 22 is turned off. Therefore, the gate capacitance of the IGBT 23 is charged by the PMOS transistor 21 so that the gate voltage rises. If the IGBT 23 is turned off, the PMOS transistor 21 is turned off and the NMOS transistor 22 is turned on and the gate capacitance of the IGBT 23 is discharged by the NMOS transistor 22 so that the gate voltage drops.

Figure 4:
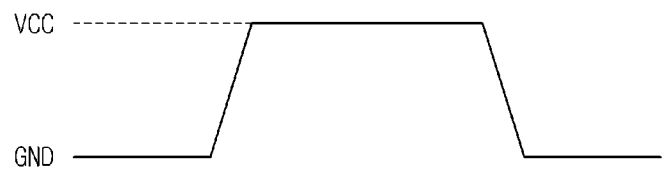
FIG. 4 is a view to explain an output waveform of a PMOS transistor of a gate driving apparatus according to the second embodiment.

FIG. 4 is a view to explain an output waveform of the PMOS transistor of the gate driving apparatus according to the second embodiment.

Referring to FIG. 4, the output waveform of the PMOS transistor 21 has no voltage drop which occurs in the output terminal of the gate driving apparatus 10 shown in FIG. 1. Thus, the output voltage of the PMOS transistor 21 may rise up to the power supply voltage VCC.

However, the resistance value when the PMOS transistor 21 is turned on is higher than the resistance value when the NMOS transistor 22 is turned on, the chip size may become enlarged although the same current capacitance is driven so that the chip manufacturing cost may be increased.

Figure 5:
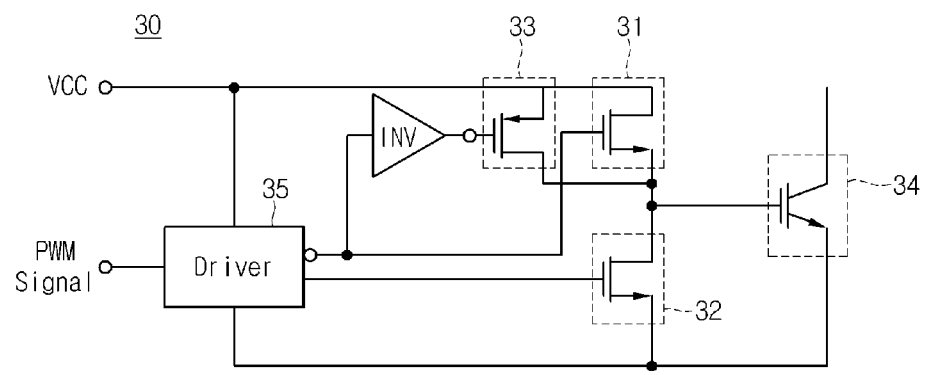
FIG. 5 is a circuit diagram of a gate driving apparatus according to the third embodiment.

FIG. 5 is a circuit diagram of a gate driving apparatus according to the third embodiment.

Referring to FIG. 5, the gate driving apparatus 30 includes a first NMOS transistor 31, a second NMOS transistor 32, a PMOS transistor 33, an IGBT 34 and a driver 35.

The first NMOS transistor 31 is located higher than the second NMOS transistor 32.

A drain terminal of the first NMOS transistor 31 is connected to a power supply terminal VCC and a gate terminal of the PMOS transistor 33, a source terminal of the first NMOS transistor 31 is connected to a drain terminal of the second NMOS transistor 32, a gate terminal of the IGBT 34, and a drain terminal of the PMOS transistor 33. A gate terminal of the first NMOS transistor 31 is connected to the driver 35.

The second NMOS transistor 32 is located lower than the first NMOS transistor 31. The drain terminal of the second NMOS transistor 32 is connected to the source terminal of the first NMOS transistor 31, the gate terminal of the IGBT 34, and the drain terminal of the PMOS transistor 33. A source terminal of the second NMOS transistor 32 is grounded and a gate terminal of the second NMOS transistor 32 is connected to the driver 35.

The PMOS transistor 33 may be connected to the first NMOS transistor 31 in parallel. In detail, a source terminal of the PMOS transistor 33 is connected to the power supply terminal VCC, the drain terminal of the PMOS transistor 33 is connected to the source terminal of the first NMOS transistor 31, the drain terminal of the second NMOS transistor 32 and the gate terminal of the IGBT 34. A gate terminal of the PMOS transistor 33 is connected to the driver 35.

An emitter terminal of the IGBT 34 is grounded and the gate terminal of the IGBT 34 is connected to the source terminal of the first NMOS transistor 31, the drain terminal of the second NMOS transistor 32 and the drain terminal of the PMOS transistor 33.

The driver 35 receives the PWM signal from the outside to drive the IGBT 34 by supplying current to the gate of the IGBT 34.

A signal having intensity the same as that of a signal output from the driver 35 and a phase opposite to that of the signal output from the driver 35 is input into the gate terminal of the first NMOS transistor 31 and the first NMOS transistor 31 transfers the signal to the gate terminal of the IGBT 34.

The first NMOS transistor 31 can amplify the current of the signal output from the driver 35.

The PMOS transistor 33 receives the signal output from the driver 35 through the gate terminal and transfers the signal to the gate terminal of the IGBT 34.

The first NMOS transistor 31 and the PMOS transistor 33 may charge the gate capacitance of the IGBT 34. The gate capacitance refers to parasitic capacitance generated from the IGBT 34 itself.

The second NMOS transistor 32 may discharge the gate capacitance of the IGBT 34.

The gate capacitance of the IGBT 34 may be charged through the turn-on of the first NMOS transistor 31 and the PMOS transistor 33 and the turn-off of the second NMOS transistor 32 and may be discharged through the turn-off of the first NMOS transistor 31 and the PMOS transistor 33 and the turn-on of the second NMOS transistor 32. That is, the gate capacitance of the IGBT 34 may be charged or discharged through the operation of the three switching devices so that the IGBT 34 can be driven.

The IGBT 34 is connected to a motor and a load to serve as a switching device.

The gate driving apparatus 30 may further include a control unit (not shown) that outputs driving signals for the first NMOS transistor 31, the second NMOS transistor 32 and the IGBT 34. The driving signal may be a turn-on signal or a turn-off signal.

The driver 35 drives the gate driving apparatus 30 and can prevent the arm short by setting a dead time upon the operation of the first and second NMOS transistors 31 and 32. The dead time signifies a time during which the other switching device is not turned on until one switching device is completely turned off. If the dead time is not set in the switching device, two switching devices may be simultaneously turned on, so excessive current may flow in a short period of time, so that the efficiency is lowered and the switching devices are damaged.

According to one embodiment, the time value of the dead time may be preset when the gate driving apparatus 30 is designed, but the embodiment is not limited thereto. The time value of the dead time may vary depending on the setting of the user.

Figure 6:
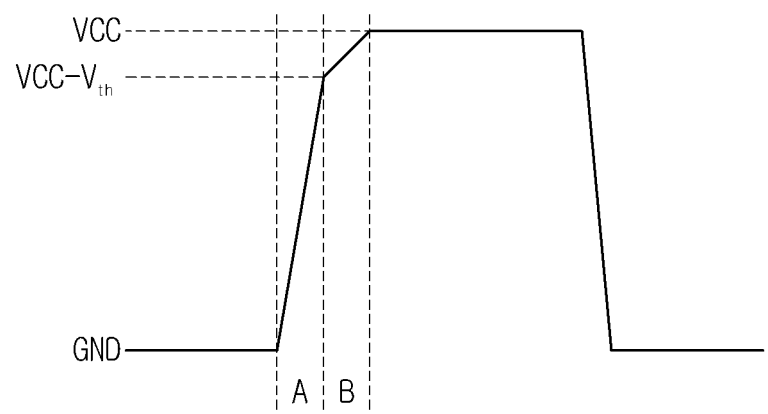
FIG. 6 is a view to explain an output waveform of a gate driving apparatus according to the third embodiment.

FIG. 6 is a view to explain an output waveform of the gate driving apparatus according to the third embodiment.

Referring to FIG. 6, before an A section of the output waveform, the turn-off signal is input into the gate terminal of the first NMOS transistor 31 and the gate terminal of the PMOS transistor 33 and the turn-on signal is input into the gate terminal of the second NMOS transistor 32, so the output voltage of the gate driving apparatus 30 is maintained at 0 V.

In the A section, the turn-on signal is input into the gate terminal of the first NMOS transistor 31 and the gate terminal of the PMOS transistor 33 and the turn-off signal is input into the gate terminal of the second NMOS transistor 32, so the output voltage of the gate driving apparatus 30 rises rapidly.

A B section shows the output waveform of the gate driving apparatus 30 in a state that the turn-off signal is being input into the gate terminal of the first NMOS transistor 31 and the gate terminal of the PMOS transistor 33. In this case, as the output voltage of the first NMOS transistor 31 rises, the voltage between the gate terminal and the source terminal of the first NMOS transistor 31 becomes lower than the threshold voltage Vth, so the first NMOS transistor 31 is turned off. However, the PMOS transistor 33 is still turned on while charging the gate capacitance of the IGBT, so the output voltage of the gate driving apparatus 30 may reach the power supply voltage Vcc.

As described above, according to the third embodiment, the output voltage of the gate driving apparatus 30 may reach the power supply voltage Vcc, so the damage to the switching device caused by the output voltage drop can be prevented.

Although embodiments have been described with reference to a number of illustrative embodiments thereof, it should be understood that numerous other modifications and embodiments can be devised by those skilled in the art that will fall within the spirit and scope of the principles of this disclosure.

More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A gate driving apparatus comprising:
   a first switching device;
   a second switching device that outputs a signal to charge a capacitance of the first switching device;
   a third switching device connected in parallel to the second switching device to prevent a drop of a voltage output from the second switching device; and
   a fourth switching device that outputs a signal to discharge the capacitance of the first switching device,
   wherein the first switching device is an insulated gate bipolar transistor, the second and fourth switching devices are NMOS transistors and the third switching device is a PMOS transistor, and wherein
   the third switching device charges the capacitance of the first switching device when the second switching device is turned off.

2. The gate driving apparatus of claim 1, further comprising a driver that receives a pulse width modulation signal to drive the first switching device by supplying a current to the first switching device.

3. The gate driving apparatus of claim 2, wherein the driver drives the second switching device and the fourth switching device while setting a dead time.

4. The gate driving apparatus of claim 2, wherein the driver turns on the second and third switching devices and turns off the fourth switching device.

5. The gate driving apparatus of claim 2, wherein the driver turns off the second and third switching devices and turns on the fourth switching device.

6. The gate driving apparatus of claim 1, wherein the capacitance of the first switching device is a gate capacitance of the insulated gate bipolar transistor.

7. The gate driving apparatus of claim 1, wherein the capacitance of the first switching device is a parasitic capacitance generated in the first switching device.

8. A gate driving apparatus including a power source and a driver, the gate driving apparatus comprising:
   a first NMOS transistor;
   a second NMOS transistor;
   a PMOS transistor; and
   an insulated gate bipolar transistor,
   wherein a drain terminal of the first NMOS transistor is connected to a terminal of the power source and the PMOS transistor, a gate terminal of the first NMOS transistor is connected to the driver, and a source terminal of the first NMOS transistor is connected to a drain terminal of the PMOS transistor, a drain terminal of the second NMOS transistor and a gate terminal of the insulated gate bipolar transistor,
   a gate terminal of the PMOS transistor is connected to the driver,
   a gate terminal of the second NMOS transistor is connected to the driver, and
   a source terminal of the second NMOS transistor and an emitter terminal of the insulated gate bipolar transistor are grounded,
   wherein the PMOS transistor charges the capacitance of the insulated gate bipolar transistor when the first NMOS transistor is turned off.

9. The gate driving apparatus of claim 8, wherein the PMOS transistor drops an output voltage of the first NMOS transistor.

10. The gate driving apparatus of claim 8, wherein the driver turns on the first NMOS transistor and the PMOS transistor and turns off the second NMOS transistor to charge a gate capacitance of the insulated gate bipolar transistor.

11. The gate driving apparatus of claim 8, wherein the driver turns off the first NMOS transistor and the PMOS transistor and turns on the second NMOS transistor to discharge a gate capacitance of the insulated gate bipolar transistor.

12. The gate driving apparatus of claim 8, wherein the driver prevents an arm short among the first NMOS transistor, the PMOS transistor and the second NMOS transistor by setting a dead time.

* * * * *